(12) United States Patent
Yoo et al.

(10) Patent No.: US 12,254,940 B2
(45) Date of Patent: Mar. 18, 2025

(54) METHODS FOR REAL-TIME REPAIRING OF MEMORY FAILURES CAUSED DURING OPERATIONS, MEMORY SYSTEMS PERFORMING REPAIRING METHODS, AND DATA PROCESSING SYSTEMS INCLUDING REPAIRING MEMORY SYSTEMS

(71) Applicant: Samsung Electronics Co., Ltd., Suwon-si (KR)

(72) Inventors: Yoonyul Yoo, Suwon-si (KR); Kwangmin Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 18/124,733

(22) Filed: Mar. 22, 2023

(65) Prior Publication Data
US 2023/0386598 A1     Nov. 30, 2023

(30) Foreign Application Priority Data

May 31, 2022    (KR) ........................ 10-2022-0066694

(51) Int. Cl.
*G11C 29/44*     (2006.01)
*G06F 11/07*     (2006.01)
*G11C 29/00*     (2006.01)

(52) U.S. Cl.
CPC ........ *G11C 29/4401* (2013.01); *G06F 11/073* (2013.01); *G06F 11/076* (2013.01); *G06F 11/0766* (2013.01); *G11C 29/76* (2013.01); *G11C 2029/4402* (2013.01)

(58) Field of Classification Search
CPC ................ G11C 29/4401; G11C 29/76; G11C 2029/4402; G11C 2029/0411; G11C 29/42; G11C 29/52; G06F 11/073; G06F 11/076; G06F 11/0766; G06F 11/1048; G06F 11/1064; G06F 11/1448; G06F 11/1458; G06F 13/1668
See application file for complete search history.

(56) References Cited

U.S. PATENT DOCUMENTS

| | | | |
|---|---|---|---|
| 6,339,546 B1 * | 1/2002 | Katayama | G11C 29/42 |
| | | | 714/E11.049 |
| 7,337,291 B2 | 2/2008 | Abadi et al. | |
| 8,386,836 B2 | 2/2013 | Burger et al. | |

(Continued)

*Primary Examiner* — Steve N Nguyen
(74) *Attorney, Agent, or Firm* — Myers Bigel, P.A.

(57) ABSTRACT

An operating method of a memory controller that controls an operation of a memory device that includes a memory region and a repair memory region. The operating method may include receiving an address associated with the memory region that is included in a first read command and data read out from the memory region associated with the address, decoding the data using an error correction code and detecting an error included in the data, generating error type information indicating a type of an error included in the data, updating, based on the error type information, a count value associated with the address, the count value indicating a number of times that the type of error indicated by the error type information has occurred for the address, comparing the count value with a threshold value, and backing up the data that is stored in the memory region associated with the address to the repair memory region when the count value is equal to the threshold value.

20 Claims, 8 Drawing Sheets

(56) References Cited

U.S. PATENT DOCUMENTS

| | | | |
|---|---|---|---|
| 9,030,899 B2 | 5/2015 | Lee | |
| 9,396,079 B2 | 7/2016 | Ku | |
| 9,424,123 B2 | 8/2016 | Leischner et al. | |
| 9,575,125 B1* | 2/2017 | Andre | G11C 29/10 |
| 9,606,851 B2 | 3/2017 | Healy et al. | |
| 9,812,222 B2 | 11/2017 | Kim et al. | |
| 11,204,825 B2* | 12/2021 | Ware | G11C 29/52 |
| 2004/0034825 A1* | 2/2004 | Jeddeloh | G11C 29/48 |
| | | | 714/733 |
| 2005/0120265 A1* | 6/2005 | Pline | G11C 29/76 |
| | | | 714/6.32 |
| 2009/0132876 A1* | 5/2009 | Freking | G11C 29/76 |
| | | | 714/723 |
| 2011/0041016 A1 | 2/2011 | O'Connell | |
| 2012/0311381 A1* | 12/2012 | Porterfield | G06F 11/2053 |
| | | | 714/E11.054 |
| 2016/0042809 A1* | 2/2016 | Kim | G11C 29/44 |
| | | | 714/719 |
| 2016/0162352 A1* | 6/2016 | Singhai | G06F 11/1048 |
| | | | 714/773 |
| 2019/0130984 A1* | 5/2019 | Jean | G11C 16/32 |
| 2020/0004652 A1* | 1/2020 | Niu | G11C 29/76 |
| 2020/0241984 A1* | 7/2020 | Shim | G06F 11/1658 |
| 2021/0311823 A1* | 10/2021 | Schat | G06F 11/1068 |
| 2022/0336037 A1* | 10/2022 | Noguchi | G11C 29/76 |

\* cited by examiner

FIG. 2

Correctable error count value table for each address — 223

| Address | Count Value |
|---|---|
| C_ADD_1 | CNT1_1 |
| C_ADD_2 | CNT1_2 |
| C_ADD_3 | CNT1_3 |
| ⋮ | ⋮ |
| C_ADD_n | CNT1_n |

Uncorrectable error count value table for each address — 227

| Address | Count Value |
|---|---|
| UC_ADD_1 | CNT2_1 |
| UC_ADD_2 | CNT2_2 |
| UC_ADD_3 | CNT2_3 |
| ⋮ | ⋮ |
| UC_ADD_m | CNT2_m |

Repair Address List

| Repair Address |
|---|
| RPADD_1 |
| RPADD_2 |
| RPADD_3 |
| ⋮ |
| RPADD_K |

LIST

FIG. 5

Address-Repair Address Mapping Table

| Input Address | Repair Address |
|---|---|
| IADD_1 | RPADD_1 |
| IADD_2 | RPADD_2 |
| IADD_3 | RPADD_3 |
| ⋮ | ⋮ |
| IADD_L | RPADD_L |

AMP

METHODS FOR REAL-TIME REPAIRING OF MEMORY FAILURES CAUSED DURING OPERATIONS, MEMORY SYSTEMS PERFORMING REPAIRING METHODS, AND DATA PROCESSING SYSTEMS INCLUDING REPAIRING MEMORY SYSTEMS

CROSS-REFERENCE TO RELATED APPLICATION

This application claims priority under 35 U.S.C. § 119 to Korean Patent Application No. 10-2022-0066694 filed on May 31, 2022, in the Korean Intellectual Property Office, and the entire contents of the above-identified application are incorporated by reference herein.

TECHNICAL FIELD

Aspects of the present disclosure relate to methods for repairing memory failures or memory faults in real time, and more particularly, relate to methods that enable memory controllers to repair, in real time, memory failures that are caused during runtime. Aspects of the present disclosure also relate to memory systems that perform or are configured to perform the methods of real-time repairing, and to data processing devices that include such memory systems.

BACKGROUND

As memory devices that include memory cells are increasingly miniaturized, occurrences of failures or faults in at least one of the memory cells due to process, voltage, and temperature (PVT) variations and/or data patterns is increasing.

When a memory controller that controls a memory device reads data that is stored in faulty memory cells of a memory cell array included in the memory device, an error correcting code (ECC) engine included in the memory controller may be configured to check whether an error is present in the read data. When an error is detected, in some instances the ECC engine can correct the error. The ECC engine can process both correctable errors and uncorrectable errors included in the read data.

In general, there is a tendency for an error included in data to progress from a correctable error to an uncorrectable error. Accordingly, in cases where a correctable error or an uncorrectable error included in data is not handled appropriately, it may be impossible to use the memory device itself or the memory device itself may be determined as a failed or faulty memory device.

SUMMARY

Some embodiments of the present disclosure may provide methods for repairing faulty memory cells, which may be detected as such during the runtime of a memory device. The repair methods provided herein may provide for repairing the faulty memory cells dynamically and in real time using repair memory cells, for the purposes of preventing the memory device itself (that is, the overall memory device) from being determined as a failure memory device and increasing the lifetime of the memory device. Some embodiments of the present disclosure also provide memory systems that perform or are configured to perform the methods provided herein, and some embodiments of the present disclosure provide data processing devices that include such memory systems.

According to some embodiments, an operating method of a memory controller which controls an operation of a memory device is provided. The memory device may include a memory region and a repair memory region, and the operating method may include receiving an address associated with a memory region that is included in a first read command and data read out from the memory region associated with the address, decoding the data using an error correction code and detecting an error included in the data, generating error type information indicating a type of the error included in the data, updating, based on the error type information, a count value associated with the address, the count value indicating a number of times that the type of error indicated by the error type information has occurred for the address, comparing the count value with a threshold value, and backing up the data that is stored in the memory region associated with the address to the repair memory region when the count value is equal to the threshold value.

According to some embodiments, a memory controller which controls an operation of a memory device is provided. The memory device may include a memory region and a repair memory region, and the memory controller may include an error correction code decoder that receives an address associated with the memory region that is included in a first read command and data read out from the memory region associated with the address, performs error correction code decoding on the data, generates error type information about a type of an error included in the data, and outputs the address and the error type information to an error logger. The error logger receives the address and the error type information, updates a count value that indicates a number of times the type of error indicated by the error type information has occurred for the address, and outputs the address and the count value.

According to some embodiments, a memory system includes a memory device that includes a memory region and a repair memory region, and a memory controller that controls an operation of the memory device. The memory controller includes an error correction code decoder that receives an address associated with the memory region that is included in a first read command and data read out from the memory region associated with the address, perform error correction code decoding on the data, generates error type information about a type of an error included in the data, and outputs the address and the error type information data, and an error logger that receives the address and the error type information from the error correction code decoder, updates a count value that indicates a number of times the type of error indicated by the error type information has occurred for the address, and outputs the address and the count value.

In some embodiments, the memory controller further includes an error checker that receives the address and the count value from the error logger, compares the count value and a threshold value, and outputs the address and a control signal when the count value is equal to the threshold value, and the memory controller includes a dynamic repair remapper that receives the control signal from the error logger and backs up the data stored in the memory region associated with the address to the repair memory region.

BRIEF DESCRIPTION OF THE FIGURES

The above and other objects and features of the present disclosure will become apparent by describing in detail some examples of embodiments thereof with reference to the accompanying drawings.

FIG. 2 is a diagram illustrating an example embodiment of a correctable error count value table for each address, which may be stored in an error logger illustrated in FIG. 1.

FIG. 3 is a diagram illustrating an example embodiment of an uncorrectable error count value table for each address, which may be stored in an error logger illustrated in FIG. 1.

FIG. 4 is a diagram illustrating an example embodiment of a repair address list stored in a dynamic repair remapper of FIG. 1.

FIG. 5 is a diagram illustrating an example embodiment of an address-repair address mapping table stored in a dynamic repair remapper of FIG. 1.

DETAILED DESCRIPTION

Figure 1:
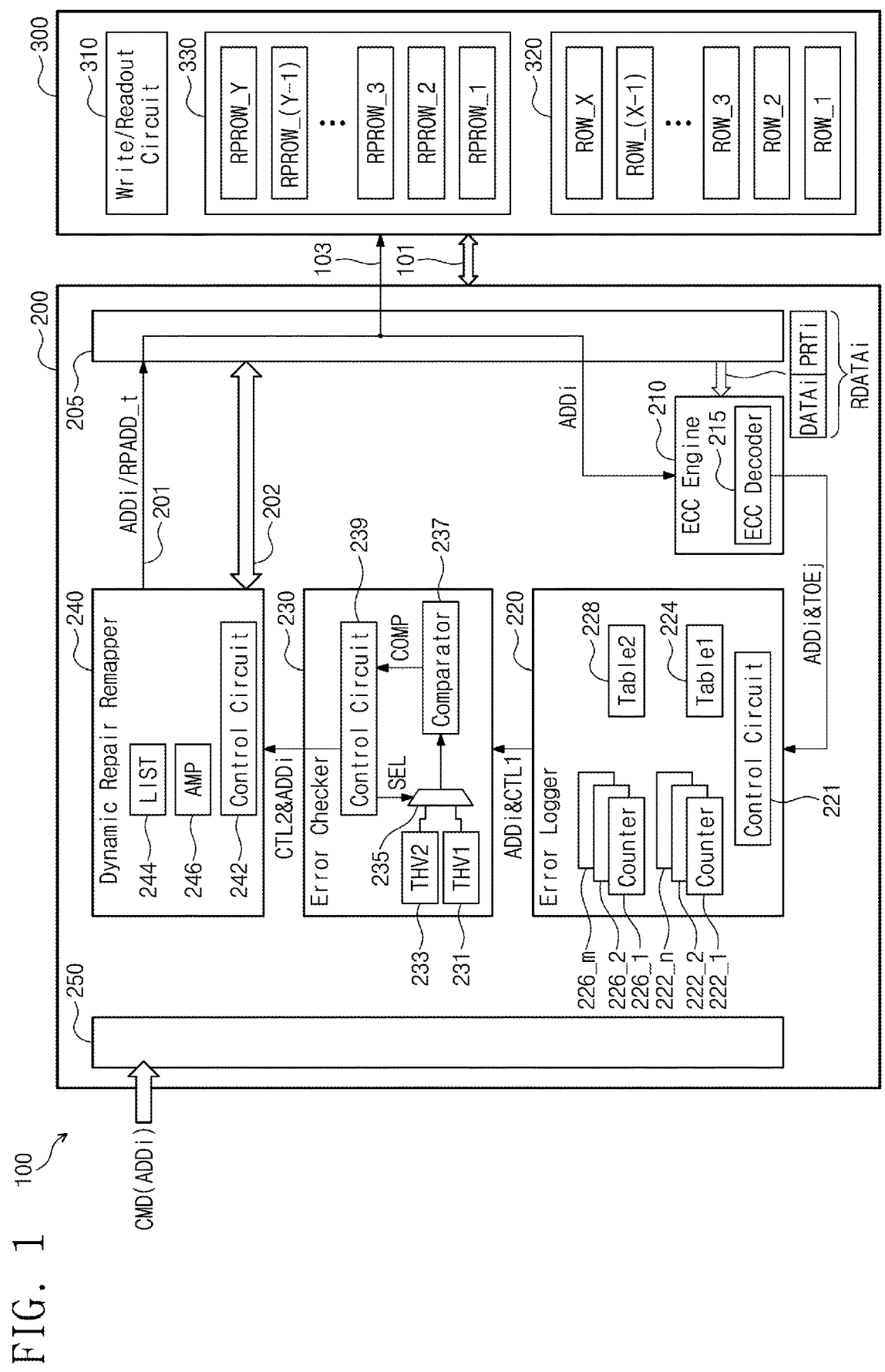
FIG. 1 is a block diagram of a memory system configured to repair in real time, or capable of repairing in real time, a memory failure caused during an operation, according to some example embodiments of the present disclosure.
Figure 6:
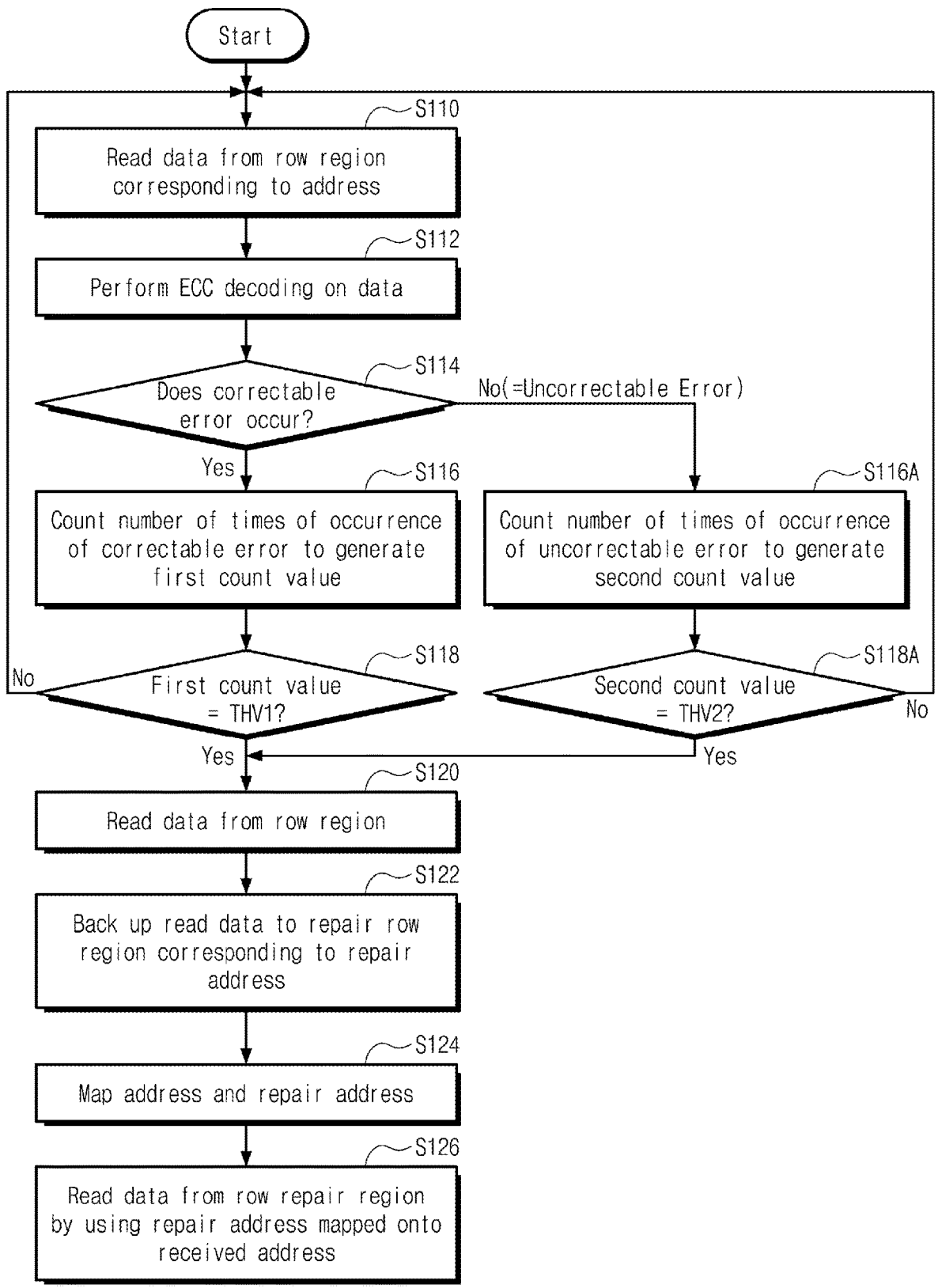
FIG. 6 is a flowchart for describing an example embodiment of an operation of a memory system illustrated in FIG. 1.

FIG. 1 is a block diagram of a memory system configured to repair in real time, or capable of repairing in real time, a memory failure caused during an operation, according to some embodiments of the present disclosure, and FIG. 6 is a flowchart for describing an example embodiment of an operation of a memory system illustrated in FIG. 1.

Referring first to FIG. 1, a memory system 100 may include a memory controller 200 and a memory device 300. Some embodiments of the present disclosure are implemented such that a faulty (or defective) row region of the memory device 300 is not repaired by an internal operation of the memory device 300, such as with a repair row region through a post package repair operation. Instead, the memory controller 200 according to the present disclosure itself repairs the faulty row region of the memory device 300 with a repair row region dynamically during runtime or in real time.

The memory controller 200 is configured to control operations of writing data in the memory device 300 and operations of reading out data from the memory device 300. That is, the memory controller 200 is configured to control write operations and read operations of the memory device 300.

The memory device 300 may include a dynamic random access memory (DRAM). The memory device 300 may include a write/readout circuit 310 and a memory cell array, and the memory cell array may include a first memory region 320 and a second memory region 330.

During a write operation, the write/readout circuit 310 may write data received through at least one data transmission line 101 in memory cells of the memory cell array. The memory cells written to may be associated with an address ADDi or RPADD_t received through at least one address transmission line 103.

During a read operation, the write/readout circuit 310 may read out data present in the memory cells that correspond to an address ADDi or RPADD_t received through the at least one address transmission line 103. The write/readout circuit 310 may send the readout data to the memory controller 200 through the at least one data transmission line 101.

That is, the write/readout circuit 310 may be configured to control the write operation and the read operation for each of the first memory region 320 and the second memory region 330.

The first memory region 320 includes a plurality of row regions ROW_1 to ROW_X, and data and parity may be stored in at least one of the row regions ROW_1 to ROW_X.

The parity may be associated with an error correction code (ECC), and in some embodiments may be stored based on one of two policies. The first policy may correspond to a collection type where parities are collected and stored in a spare region, and the second policy may correspond to a distribution type where the parity according to an ECC processing unit is stored next to the data. According to some embodiments of the present disclosure, the parity may be stored in the memory device 300 in the collection type or the distribution type. For example, the spare region may be included in the first memory region 320 or the second memory region 330.

The second memory region 330 may include a plurality of repair row regions RPROW_1 to RPROW_Y, and data backed up from the first memory region 320 may be stored in at least one of the plurality of repair row regions RPROW_1 to RPROW_Y. In some embodiments, each of the plurality of row regions ROW_1 to ROW_X and the plurality of repair row regions RPROW_1 to RPROW_Y may be a region that includes a plurality of memory cells.

For example, each of the row regions ROW_1 to ROW_X and repair row regions RPROW_1 to RPROW_Y may include a plurality of memory cells connected with at least one word line. In some embodiments described herein, "X" and "Y" are both natural numbers of 2 or more, and "X" is greater than "Y" (i.e. "X">"Y"). Stated differently, there may be more row regions in the plurality of row regions ROW_1 to ROW_X in the first memory region 320 than there are repair row regions in the plurality of repair row regions RPROW_1 to RPROW_Y in the second memory region 330.

The memory controller 200 may include a first transmission line 201, a second transmission line 202, a memory device interface 205, an ECC engine 210, an error logger (or error history logger) 220, an error checker (or error detector) 230, a dynamic repair remapper 240, and a bus interface 250.

The first transmission line 201 may include at least one transmission line that is configured to transmit the address ADDi or the repair address RPADD_t to the memory device interface 205, and the second transmission line 202 may include at least one transmission line that is configured to transmit data to the memory device 300 and/or receive data transmitted from the memory device 300 (and in some embodiments via the memory device interface 205).

Figure 10:
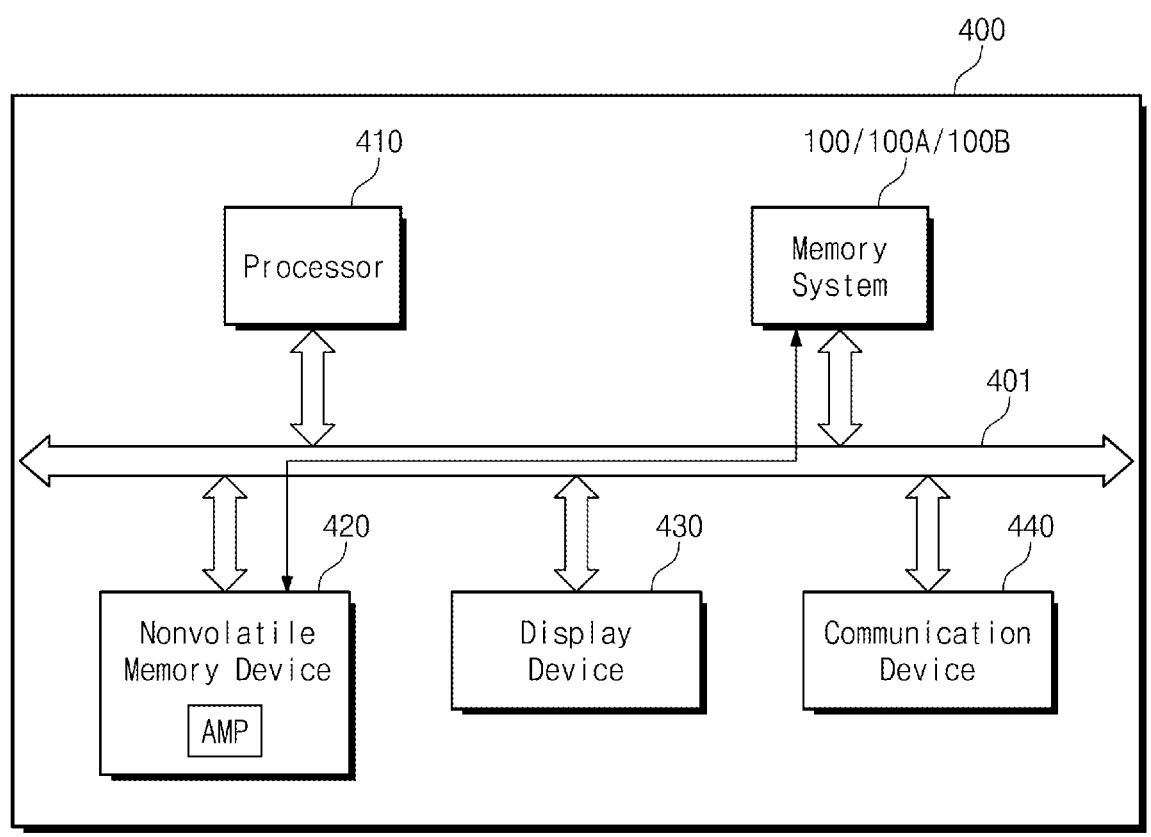
FIG. 10 is a block diagram of a data processing system including a memory system illustrated in FIG. 1, 7, or 9.

The bus interface 250 may be an interface configured to exchange data with a processor or external device or system, such as processor 410 as illustrated in FIG. 10.

The ECC engine 210 may be used to correct a single bit error. That is, when a single bit error is corrected, a system may continue to operate without interruption and without corrupting data.

In some embodiments, the memory device 300 may be implemented with a DRAM, and the memory device interface 205 may be implemented as a DRAM interface. The DRAM interface 205 may be configured to transmit the address ADDi (i being any one of 1 to X) or RPADD_t (t being any one of 1 to K, described further below with respect to FIG. 4) to the ECC engine 210 and the write/readout circuit 310.

A method for repairing dynamically a faulty (or defective) row region during the runtime depending on statistics collected regarding occurrences of a correctable error for each address (e.g., the number of times of an occurrence of a correctable error for each address) will now be described with reference to FIGS. 1 to 6.

Below, for convenience of description, an example case where a correctable error occurs in first data RDATA1 that is stored in the first row region ROW_1 and is associated with the first address ADD1 will be described.

In a first read operation, the memory device 300 may transmit the first data RDATA1 to the ECC engine 210 depending on a read command CMD including the first address ADD1 (operation S110 of FIG. 6). For example, the memory controller 200 reads the first data RDATA1 from the first row region ROW_1 associated with the first address ADD1 (S110). The first data RDATA1 may include first data bits DATA1 and first ECC parity bits PRT1. The first ECC parity bits PRT1 may protect (e.g., may perform a function of protecting) the first data bits DATA1.

An ECC decoder 215 included in the ECC engine 210 may use the first ECC parity bits PRT1 to detect and/or correct an error in the first data bits DATA1 (operation S112 of FIG. 6). The ECC decoder 215 may perform ECC decoding on the first data RDATA1 (operation S112).

The ECC engine 210 and/or ECC decoder 215 may detect whether an error in the first data RDATA1 is correctable or uncorrectable (operation S114 of FIG. 6). When an ECC decoding result of the first data RDATA1 obtained in operation S112 indicates that a correctable error is detected from the first data RDATA1 (Yes branch from operation S114), the ECC decoder 215 may transmit the first address ADD1 and first error type information TOE1 (or TOEj of FIG. 1, where j equals 1) to the error logger 220. The first error type information TOE1 may be or may refer to information indicating that an error detected by the ECC decoder 215 is a correctable error.

The error logger (or error logging circuit) 220 may include a control circuit 221, a first group of counters 222_1 to 222_n, a first memory device 223 storing a first table 224 (see FIG. 2), a second group of counters 226_1 to 226_m, and a second memory device 227 storing a second table 228 (see FIG. 3). According to some embodiments, the first table 224 and the second table 228 may be stored in one memory device (e.g., registers).

The control circuit 221 may select and operates one of the counters of the first group of counters 222_1 to 222_n depending on the first error type information TOE1 about a specific address and stores a count value of the selected counter in the first table 224.

As discussed further below, the control circuit 221 may also selectively operate one of the counters of the second group 226_1 to 226_m depending on second error type information TOE2 (or TOEj, of FIG. 1 where j equals 2) about a specific address and stores a count value of the selected counter in the second table 228. The second error type information TOE2 may be or may refer to information indicating that the error detected by the ECC decoder 215 is an uncorrectable error.

In some embodiments, "m" and "n" are natural numbers, and "m" and "n" may be equal to each other or different from each other (i.e., n=m, or n≠m). Additionally, "n" may be smaller than "X", and "m" may be smaller than "Y". In some embodiments, the first error type information TOE1 may indicate logic 1 (or data 1), and the second error type information TOE2 may indicate the logic 0 (or data 0), or vice versa. However, the present disclosure is not limited thereto.

FIG. 2 is a diagram illustrating an embodiment of a correctable error count value table 224 for each address, which may be stored in the error logger 220 illustrated in FIG. 1. Referring to FIG. 2, the first table 224 may store correctable error count values CNT1_1 to CNT1_n for respective addresses C_ADD_1 to C_ADD_n.

For example, the address C_ADD_1 may be one of the addresses ADD1 to ADDX, the address C_ADD_2 may be another of the addresses ADD1 to ADDX, and the address C_ADD_n may be yet another of the addresses ADD1 to ADDX. It is assumed that each of the correctable error count values CNT1_1 to CNT1_n is set initially to zero.

After operation of one of the counters 222_1 to 222_n in the first group or one of the counters 226_1 to 226_m in the second group, or after the count value update is performed on one of the tables 224 and 228, the control circuit 221 may transmit the address ADDi and first control information CTL1 to the address checker 230. In some embodiments, the first control information CTL1 includes a count value and the error type information TOE1 or TOE2. Additionally, in some embodiments after operation of one of the counters 222_1 to 222_n in the first group or one of the counters 226_1 to 226_m in the second group and the updating or storing of the count value therefrom in the corresponding table 224 or 228, the counter may be reset to zero by the control circuit 221, enabling the control circuit 221 to reallocate the counter (e.g., the first counter 222_1) to count errors associated with other addresses. On the other hand, in some embodiments, a specific counter (e.g., the first counter 222_1) may not be reset to the zero by the control circuit 221 after operation thereof, and the control circuit 221 may allocate the specific counter for counting errors corresponding to a specific address when the specific address and the first error type information TOE1 are received.

Returning to the example case discussed above, the control circuit 221 may receive the first error type information TOE1 together with the first address ADD1 and, based on the first error type information TOE1, may allocate the first counter 222_1 of the first group of counters 222_1 to 222_n to the first address ADD1. When the first error type information TOE1 about the first address ADD1 is received once, the first counter 222_1 may generate or increment a first count value CNT1_1 (which, in the example, now equals 1) (operation S116 of FIG. 6). Stated differently, whenever the first error type information TOE1 about the first address ADD1 is received, the first counter 222_1 may count the number of times of reception by incrementing a value stored therein.

The control circuit 221 may store (or write) the first address ADD1 (=C_ADD_1) and the first count value CNT1_1 (=1) in the first table 224 (operation S116), and may transmit the first address ADD1 and the first control information CTL1 to the error checker 230. As discussed above, the first control information CTL1 may include the first count value CNT1_1 (=1) and the first error type information TOE1.

The error checker (or error checking circuit) 230 may include a first memory 231 that stores a first threshold value THV1, a second memory device 233 that stores a second threshold value THV2, a select circuit 235, a comparator 237, and a control circuit 239. According to some embodiments, the first threshold value THV1 and the second threshold value THV2 may be stored in one memory device (e.g., a special function register (SFR)).

Each of the first threshold value THV1 and the second threshold value THV2 may be a natural number, and the first threshold value THV1 is greater than the second threshold value THV2. Below, for convenience of description, it is assumed that the first threshold value THV1 is 5 and the second threshold value THV2 is 2.

The control circuit 239 of the error checker 230 may receive the first address ADD1 and the first error type information TOE1, may generate based on the first error type information TOE1 a selection signal SEL that indicates the output of the first threshold value THV1, and may output the selection signal SEL to the select circuit 235. The select circuit 235 may be implemented with a multiplexer. The comparator 237 may compare the first threshold value THV1 and the first count value CNT1_1 and may generate a comparison signal COMP indicating that the compared values are the same (or different) from each other. Based on the comparison signal COMP indicating that the compared values are the same, the control circuit 239 may generate a second control signal that directs the backup of the first data RDATA1.

Continuing the example from above, the comparator 237 may compare the first threshold value THV1 (=5) and the first count value CNT1_1 (=1) to generate a comparison signal COMP (operation S118 of FIG. 6); as the first threshold value THV1 (=5) is different from the first count value CNT1_1 (=1) (No branch from operation S118), the control circuit 239 does not generate a second control signal CTL2 that directs the backup of the first data RDATA1, since the comparison signal COMP indicates that the first threshold value THV1 (=5) is different from the first count value CNT1_1 (=1).

Afterward, in a second read operation, the memory device 300 may transmit the first data RDATA1 to the ECC engine 210 based on a read command CMD for the second read operation including the first address ADD1 (operation S110 of FIG. 6). When an ECC decoding result of the first data RDATA1 obtained in operation S112 indicates that a correctable error is detected from the first data RDATA1 (Yes in S114), the ECC decoder 215 may transmit the first error type information TOE1 to the error logger 220 together with the first address ADD1.

The control circuit 221 may receive the first error type information TOE1 together with the first address ADD1 and may again allocate the first counter 222_1 of the first group of counters 222_1 to 222_n to the first address ADD1 based on the first error type information TOE1 (or use the previously allocated first counter 222_1). Since the first error type information TOE1 about the first address ADD1 has been received two times, the first counter 222_1 may generate the first count value CNT1_1 equal to 2 (operation S116 of FIG. 6).

The control circuit 221 may store (or update) the first count value CNT1_1 (now equal to 2) for the first address ADD1 of the first table 224 (S116) and may transmit the first address ADD1 and the first control information CTL1 to the error checker 230.

The control circuit 239 of the error checker 230 may receive the first address ADD1 and the first error type information TOE1, may generate the selection signal SEL indicating the output of the first threshold value THV1 based on the first error type information TOE1, and may output the selection signal SEL to the select circuit 235.

The comparator 237 may compare the first threshold value THV1 (=5) and the first count value CNT1_1 (=2) (S118); since the first threshold value THV1 (=5) is different from the first count value CNT1_1 (=2) (No from operation S118), the control circuit 239 again does not generate the second control signal CTL2 directing the backup of the first data RDATA1, since the comparison signal COMP indicates that the first threshold value THV1 (=5) is different from the first count value CNT1_1 (=2).

Afterwards, in a third read operation of the first data RDATA1 that is performed based on the read command CMD including the first address ADD1, the correctable error is again detected from the first data RDATA1 (Yes in S114); allocate or use the first counter 222_1 to update the first count value CNT1_1 for the first address ADD1 in the first table 224 (now equal to 3); the first threshold value THV1 (=5) is again different from the first count value CNT1_1 (=3) (No in S118), and the control circuit 239 again does not generate the second control signal CTL2 directing the backup of the first data RDATA1, since the comparison signal COMP indicates that the first threshold value THV1 (=5) is different from the first count value CNT1_1 (=3).

Also, in a fourth read operation of the first data RDATA1 that is performed based on the read command CMD including the first address ADD1, the correctable error is again detected from the first data RDATA1 (Yes in S114); allocate or use the first counter 222_1 to update the first count value CNT1_1 for the first address ADD1 in the first table 224 (now equal to 4); the first threshold value THV1 (=5) is again different from the first count value CNT1_1 (=4) (No in S118), and the second control signal CTL2 directing the backup of the first data RDATA1 is again not generated.

In a fifth read operation of the first data RDATA1 that is performed based on the read command CMD including the first address ADD1, when the correctable error is detected from the first data RDATA1 (Yes in S114), the ECC decoder 215 transmits the first error type information TOE1 to the error logger 220 together with the first address ADD1.

The control circuit 221 receives the first error type information TOE1 together with the first address ADD1 and, based on the first error type information TOE1, again allocates the first counter 222_1 of the first group of counters 222_1 to 222_n to the first address ADD1 depending on the first error type information TOE1. Since the first error type information TOE1 about the first address ADD1 has now been received five times, the first counter 222_1 may generate the first count value CNT1_1 equal to 5 (S116).

The control circuit 221 may store (or update) the first count value CNT1_1 (=5) for the first address ADD1 of the first table 224 (S116) and may transmit the first address ADD1 and the first control information CTL1 to the error checker 230.

The control circuit 239 of the error checker 230 may receive the first address ADD1 and the first error type information TOE1, may generate the selection signal SEL indicating the output of the first threshold value THV1 depending on the first error type information TOE1, and may output the selection signal SEL to the select circuit 235.

The comparator 237 may compare the first threshold value THV1 (=5) and the first count value CNT1_1 (=5) (S118); since the first threshold value THV1 (=5) is now equal to the first count value CNT1_1 (=5) (Yes branch from operation S118 of FIG. 6), the control circuit 239 generates the second control signal CTL2 directing the backup of the first data RDATA1, as the comparison signal COMP indicates that the first threshold value THV1 (=5) is equal to the first count value CNT1_1 (=5). The control circuit 239 transmits the second control signal CTL2 and the first address ADD1 to the dynamic repair remapper 240.

A control circuit 242 of the dynamic repair remapper 240 may receive the first address ADD1 and the second control signal CTL2 and may read the first data RDATA1 from the first row region ROW_1 associated with the first address ADD1 in response to the second control signal CTL2 directing the backup of the first data RDATA1 (operation S120 of FIG. 6). For example, operation S120 corresponds to an internal read operation.

FIG. 4 is a diagram illustrating an example embodiment of a repair address list stored in a dynamic repair remapper 240 of FIG. 1. Referring to FIGS. 1 and 4, a repair address list "LIST" may be stored in a first memory device 244 and may include repair addresses RPADD_1 to RPADD_K.

The first repair address RPADD_1 may be an address associated with one of the repair row regions RPROW_1 to RPROW_Y, the second repair address RPADD_2 may be an address associated with another of the repair row regions RPROW_1 to RPROW_Y, and the K-th repair address RPADD_K may be an address associated with another of the repair row regions RPROW_1 to RPROW_Y. Herein, "K" may be a natural number of 2 or more, and "K" may be smaller than "Y".

The control circuit 242 of the dynamic repair remapper 240 may read the first repair address RPADD_1 of the repair addresses RPADD_1 to RPADD_K included in the repair address list "LIST" stored in the first memory device 244, and may back up the first data RDATA1 read out from the first row region ROW_1 to the first repair row region RPROW_1 associated with the first repair address RPADD_1 (operation S122 of FIG. 6). In some embodiments, the control circuit 242 may save the first data RDATA1 in operation S120 and may restore the first data RDATA1 at the first repair row region RPROW_1 in operation S122.

After the first data RDATA1 are backed up to the first repair row region RPROW_1, the control circuit 242 of the dynamic repair remapper 240 may map the first address ADD1 (=IADD_1) and the first repair address RPADD_1 one to one, and may store mapping information AMP in a second memory device 246 (operation S124 of FIG. 6). According to some embodiments, the repair address list "LIST" and the mapping information AMP may be stored in one memory device.

FIG. 5 is a diagram illustrating an example embodiment of an address-repair address mapping table stored in a dynamic repair remapper of FIG. 1.

Referring to FIG. 5, an address-repair address mapping table AMP may include repair addresses RPADD_1 to RPADD_L that are mapped respectively to correspond to input addresses IADD_1 to IADD_L. Here, "L" is a natural number of 2 or more, the input address IADD_1 may be one of the addresses ADD1 to ADDX, the input address IADD_2 may be another of the addresses ADD1 to ADDX, and the input address IADD_L may be yet another of the addresses ADD1 to ADDX.

After the first data RDATA1 are backed up (or are backed up in real time) from the first row region ROW_1 to the first repair row region RPROW_1, when the control circuit 242 of the dynamic repair remapper 240 receives the read command CMD including the first address ADD1 for a new read operation, the control circuit 242 may read the first repair address RPADD_1 mapped onto the first address ADD1 (=IADD_1) from the mapping information AMP stored in the second memory device 246 and may transmit the first repair address RPADD_1 to the memory device interface 205.

The ECC decoder 215 performs ECC decoding on the first data RDATA1 read out from the first repair row region RPROW_1 associated with the first repair address RPADD_1 and may transmit the ECC-decoded first data RDATA1 to the bus interface 250 (operation S126 of FIG. 6). The first data RDATA1 transmitted to the bus interface 250 may be provided to a processor (e.g., processor 410 of FIG. 10) that transmitted or provided the read command CMD.

In a new read operation, where the read command CMD includes the second address ADDi (e.g., i=2), the memory device 300 may transmit second data RDATAi (i=2) read from the second row region ROW_2 associated with the second address ADD2 to the ECC engine 210 (S110). The second data RDATA2 include second data bits DATA2 and second ECC parity bits PRT2.

The ECC decoder 215 included in the ECC engine 210 may use the second ECC parity bits PRT2 to detect and/or correct an error of the second data bits DATA2.

When an ECC decoding result of the second data RDATA2 obtained in operation S112 indicates that the correctable error is detected from the second data RDATA2 (Yes in S114), the ECC decoder 215 may transmit the first error type information TOE1 to the error logger 220 together with the second address ADD2.

The control circuit 221 of the error logger 220 may receive the first error type information TOE1 together with the second address ADD2 and, based on the first error type information TOE1, may allocate a second counter 222_2 of the counters 222_1 to 222_n in the first group to the second address ADD2. When the first error type information TOE1 about the second address ADD2 is received once, the second counter 222_2 may generate a count value CNT1_2 (=1).

In a new read operation, where the read command CMD including the third address ADDi (e.g., i=3), the memory device 300 transmits third data RDATAi (i=3) read from the third row region ROW_3 associated with the third address ADD3 to the ECC engine 210 (S110). The third data RDATA3 may include third data bits DATA3 and third ECC parity bits PRT3.

The ECC decoder 215 included in the ECC engine 210 may use the third ECC parity bits PRT3 to detect and/or correct an error of the third data bits DATA3.

When an ECC decoding result of the third data RDATA3 indicates that the correctable error is detected from the third data RDATA3 (Yes in S114), the ECC decoder 215 may transmit the first error type information TOE1 to the error logger 220 together with the third address ADD3.

The control circuit 221 of the error logger 220 receives the first error type information TOE1 together with the third address ADD3 and, based on the first error type information TOE1, may allocate the third counter 222_3 of the counters 222_1 to 222_n in the first group to the third address ADD3. When the first error type information TOE1 about the third address ADD3 is received once, the third counter 222_2 generates a count value CNT1_3 (=1).

Because operation S116, operation S118, operation S120, operation S122, operation S124, and operation S126 may be understood from the description given above with reference to FIG. 6, additional description will be omitted to avoid redundancy.

A method for repairing dynamically a faulty (or defective) row region during the runtime depending on statistics collected regarding occurrences of an uncorrectable error for each address (e.g., the number of times of an occurrence of an uncorrectable error for each address) is described with reference to FIGS. 1 to 6.

Below, for convenience of description, an example case where an uncorrectable error occurs in the second data RDATAi (i=2) that is stored in the second row region ROW_2 associated with the second address ADDi (i=2) will be described as an example.

In a first read operation, the memory device 300 may transmit the second data RDATA2 to the ECC engine 210 depending on the read command CMD including the second address ADD2 (operation S110 of FIG. 6). For example, the memory controller 200 may read the second data RDATA2 from the second row region ROW_2 associated with the second address ADD2 (S110). The second data RDATA2 include the second data bits DATA2 and the second ECC parity bits PRT2.

The ECC decoder 215 included in the ECC engine 210 uses the second ECC parity bits PRT2 to detect and/or correct an error of the second data bits DATA2 (operation S112 of FIG. 6). That is, the ECC decoder 215 performs ECC decoding on the second data RDATA2 (S112).

As discussed above, the ECC engine 210 and/or ECC decoder 215 may detect whether an error in the second data RDATA2 is correctable or uncorrectable (operation S114 of FIG. 6). When an ECC decoding result of the second data RDATA2 obtained in operation S112 indicates that the uncorrectable error is detected from the second data RDATA2 (No branch from operation S114), the ECC decoder 215 may transmit the second address ADDR2 and the second error type information TOE2 to the error logger 220. As described above, the second error type information TOE2 may be or may refer to information indicating that an error detected by the ECC decoder 215 is an uncorrectable error.

FIG. 3 is a diagram illustrating an embodiment of an uncorrectable error count value table 228 for each address, which may be stored in an error logger 220 illustrated in FIG. 1. Referring to FIGS. 1 and 3, the second table 228 may store uncorrectable error count values CNT2_1 to CNT2_m for respective addresses UC_ADD_1 to UC_ADD_m.

For example, the address UC_ADD_1 may be one of the addresses ADD1 to ADDX, the address UC_ADD_2 may be another of the addresses ADD1 to ADDX, and the address UC_ADD_m may be another of the addresses ADD1 to ADDX. It is assumed that each of the uncorrectable error count values CNT2_1 to CNT2_m is set initially to zero.

The control circuit 221 of the error logger 220 may receive the second error type information TOE2 together with the second address ADD2 and may allocate a first counter 226_1 of the counters 226_1 to 226_m in the second group to the second address ADD2 depending on the second error type information TOE2. When the second error type information TOE2 about the second address ADD2 is received once, the first counter 226_1 may generate a second count value CNT2_1 (=1) (operation S116A of FIG. 6).

The control circuit 221 may store (or write) the second address ADD2 (=UC_ADD_1) and the second count value CNT2_1 (=1) in the second table 228 (S116A) and may transmit the second address ADD2 and the first control information CTL1 to the error checker 230. The first control information CTL1 includes the second count value CNT2_1 (=1) and the second error type information TOE2.

The control circuit 239 of the error checker 230 may receive the second address ADD2 and the second error type information TOE2, may generate the selection signal SEL indicating the output of the second threshold value THV2 based on the second error type information TOE2, and may output the selection signal SEL to the select circuit 235.

The comparator 237 may compare the second threshold value THV2 (=2) and the second count value CNT2_1 (=1) (operation S118A of FIG. 6); as the second threshold value THV2 (=2) is different from the second count value CNT2_1 (=1) (No in S118A), the control circuit 239 does not generate the second control signal CTL2 that directs the backup of the second data RDATA2, since the comparison signal COMP indicates that the second threshold value THV2 (=2) is different from the second count value CNT2_1 (=1).

Afterward, in a second read operation, the memory device 300 may transmit the second data RDATA2 to the ECC engine 210 based on the read command CMD including the second address ADD2 (operation S110 of FIG. 6). When an ECC decoding result of the second data RDATA2 obtained in operation S112 indicates that the uncorrectable error is detected from the second data RDATA2 (No in S114), the ECC decoder 215 transmits the second error type information TOE2 to the error logger 220 together with the second address ADD2.

The control circuit 221 of the error logger 220 may receive the second error type information TOE2 together with the second address ADD2 and may again allocate the first counter 226_1 of the counters 226_1 to 226_m in the second group to the second address ADD2 based on the second error type information TOE2 (or use the previously allocated first counter 226_1). After the second error type information TOE2 about the second address ADD2 is received two times, the first counter 226_1 may generate the second count value CNT2_1 (=2) (S116A).

The control circuit 221 may store (or update) the second count value CNT2_1 (=2) for the second address ADD2 of the second table 228 (S116A) and transmits the second address ADD2 and the first control information CTL1 to the error checker 230.

As discussed above, in some embodiments the second count value CNT2_1 of the first counter 226_1 may be reset to the zero by the control circuit 221 after operation thereof, and the control circuit 221 may allocate the first counter 226_1 to another address when the second error type information TOE2 is received for the other address. On the other hand, in some embodiments, a specific counter (e.g., the first counter 226_1) may not be reset to the zero by the control circuit 221 after operation thereof, and the control circuit 221 may allocate a specific counter of the second group of counters 226_1 to 226_m for counting errors corresponding to a specific address when the specific address and the second error type information TOE2 are received.

The control circuit 239 of the error checker 230 may receive the second address ADD2 and the second error type information TOE2, may generate the selection signal SEL indicating the output of the second threshold value THV2 based on the second error type information TOE2, and may output the selection signal SEL to the select circuit 235.

The comparator 237 may compare the second threshold value THV2 (=2) and the second count value CNT2_1 (=2) (operation S118A of FIG. 6); as the second threshold value THV2 (=2) is equal to the second count value CNT2_1 (=2)

(Yes branch from operation S118A), the control circuit 239 may generate the second control signal CTL2 that directs the backup of the second data RDATA2 since the comparison signal COMP indicates that the second threshold value THV2 (=2) is equal to the second count value CNT2_1 (=2), and may transmit the second control signal CTL2 and the second address ADD2 to the dynamic repair remapper 240.

The control circuit 242 of the dynamic repair remapper 240 may receive the second address ADD2 (=UC_ADD_1) and the second control signal CTL2 and may read the second data RDATA2 from the second row region ROW_2 associated with the second address ADD2 in response to the second control signal CTL2 directing the backup of the second data RDATA2 (operation S120 of FIG. 6).

The control circuit 242 may read the second repair address RPADD_2 of the repair addresses RPADD_1 to RPADD_K included in the repair address list "LIST" stored in the memory device 244 and may back up the second data RDATA2 read out from the second row region ROW_2 to the second repair row region RPROW_2 associated with the second repair address RPADD_2 (operation S122 of FIG. 6).

After the second data RDATA2 are backed up to the second repair row region RPROW_2, the control circuit 242 may map the second address ADD2 (=IADD_2) and the second repair address RPADD_2 one to one and may store the mapping information AMP in the second memory device 246 (operation S124 of FIG. 6).

After the second data RDATA2 are backed up (or are backed up in real time) from the second row region ROW_2 to the second repair row region RPROW_2, when the control circuit 242 of the dynamic repair remapper 240 receives the read command CMD including the second address ADD2 for a new read operation, the control circuit 242 may read the second repair address RPADD_2 mapped onto the second address ADD2 (=IADD_2) from the mapping information AMP stored in the second memory device 246, and may transmit the second repair address RPADD_2 to the memory device interface 205.

The ECC decoder 215 may perform ECC decoding on the second data RDATA2 read out from the second repair row region RPROW_2 associated with the second repair address RPADD_2, and may transmit the ECC-decoded second data RDATA2 to the bus interface 250 (operation S126 of FIG. 6).

In a new read operation, where the read command CMD includes the third address ADDi (e.g., i=3), the memory device 300 may transmit the third data RDATAi (i=3) read from the third row region ROW_3 associated with the third address ADD3 to the ECC engine 210 (operation S110).

When an ECC decoding result of the third data RDATA3 obtained in operation S112 indicates that the uncorrectable error is detected from the third data RDATA3 (No in S114), the ECC decoder 215 may transmit the second error type information TOE2 to the error logger 220 together with the third address ADD3.

The control circuit 221 of the error logger 220 may receive the second error type information TOE2 together with the third address ADD3 and allocates the second counter 226_2 of the counters 226_1 to 226_m in the second group to the third address ADD3 based on the second error type information TOE2. For example, when the second error type information TOE2 about the third address ADD3 is received once, the second counter 226_2 generates a count value CNT2_2 (=1).

In a new read operation, where the read command CMD includes the fourth address ADDi (i=4), the memory device 300 may transmit the fourth data RDATAi (i=4) read from the fourth row region ROW_4 associated with the fourth address ADD4 to the ECC engine 210 (S110).

When an ECC decoding result of the fourth data RDATA4 obtained in operation S112 indicates that the uncorrectable error is detected from the fourth data RDATA4 (No in S114), the ECC decoder 215 may transmit the second error type information TOE2 to the error logger 220 together with the fourth address ADD4.

The control circuit 221 of the error logger 220 receives the second error type information TOE2 together with the fourth address ADD4 and may allocate a third counter 226_3 of the counters 226_1 to 226_m in the second group to the fourth address ADD4 depending on the second error type information TOE2. For example, when the second error type information TOE2 about the fourth address ADD4 is received once, the third counter 226_3 generates a count value CNT2_3 (=1).

Figure 7:
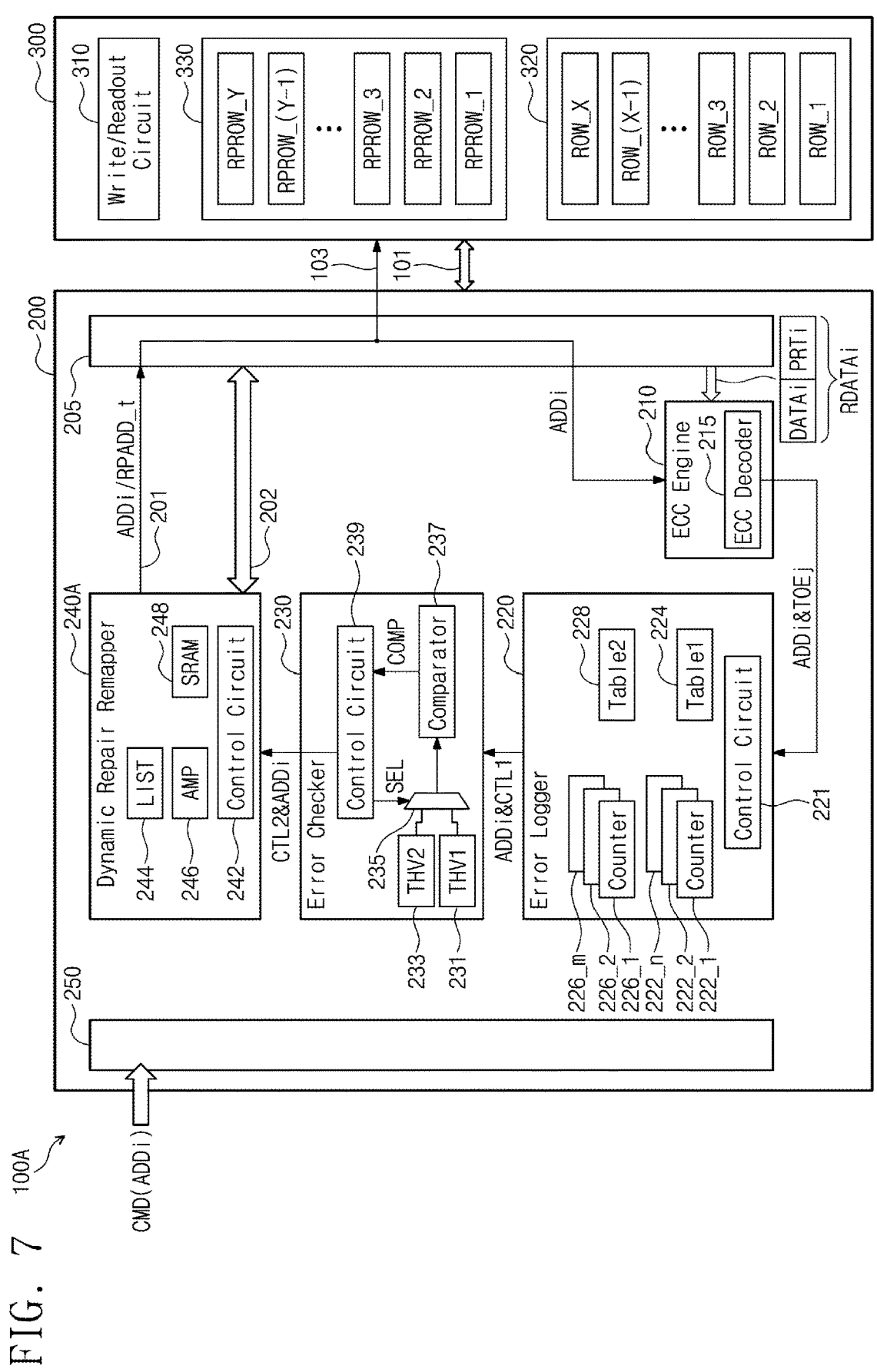
FIG. 7 is a block diagram of a memory system configured to repair in real time, or capable of repairing in real time, a memory failure caused during an operation, according to some embodiments of the present disclosure.

FIG. 7 is a block diagram of a memory system capable of repairing a memory failure caused during an operation in real time, according to embodiments of the present disclosure.

In contrast to the dynamic repair remapper 240 illustrated in FIG. 1, a dynamic repair remapper 240A illustrated in FIG. 7 may include a third memory device 248, for example, a static random access memory (SRAM).

Referring to FIGS. 1 to 7, the control circuit 242 of the dynamic repair remapper 240A may receive, from the control circuit 239 of the error checker 230, the first address ADD1 and the second control signal CTL2 that directs the backup of the first data RDATA1. The control circuit 242 may read the first data RDATA1 from the first row region ROW_1 associated with the first address ADD1 in response to the second control signal CTL2, and may store the first data RDATA1 in the SRAM 248 (operation S120 of FIG. 6).

The control circuit 242 of the dynamic repair remapper 240A may read the first repair address RPADD_1 of the repair addresses RPADD_1 to RPADD_K included in the repair address list "LIST" stored in the memory device 244 and may back up the first data RDATA1 stored in the SRAM 248 in operation S120 to the first repair row region RPROW_1 associated with the first repair address RPADD_1 (S122).

As another example, the control circuit 242 of the dynamic repair remapper 240A may receive the second address ADD2 (=UC_ADD_1) and the second control signal CTL2 that directs the backup of the second data RDATA2, may read the second data RDATA2 from the second row region ROW_2 associated with the second address ADD2 in response to the second control signal CTL2, and may store the second data RDATA2 in the SRAM 248 (S120).

The control circuit 242 of the dynamic repair remapper 240A reads the second repair address RPADD_2 of the repair addresses RPADD_1 to RPADD_K included in the repair address list "LIST" stored in the memory device 244 and may back up the second data RDATA2 stored in the SRAM 248 to the second repair row region RPROW_2 associated with the second repair address RPADD_2 (S122).

Figure 8:
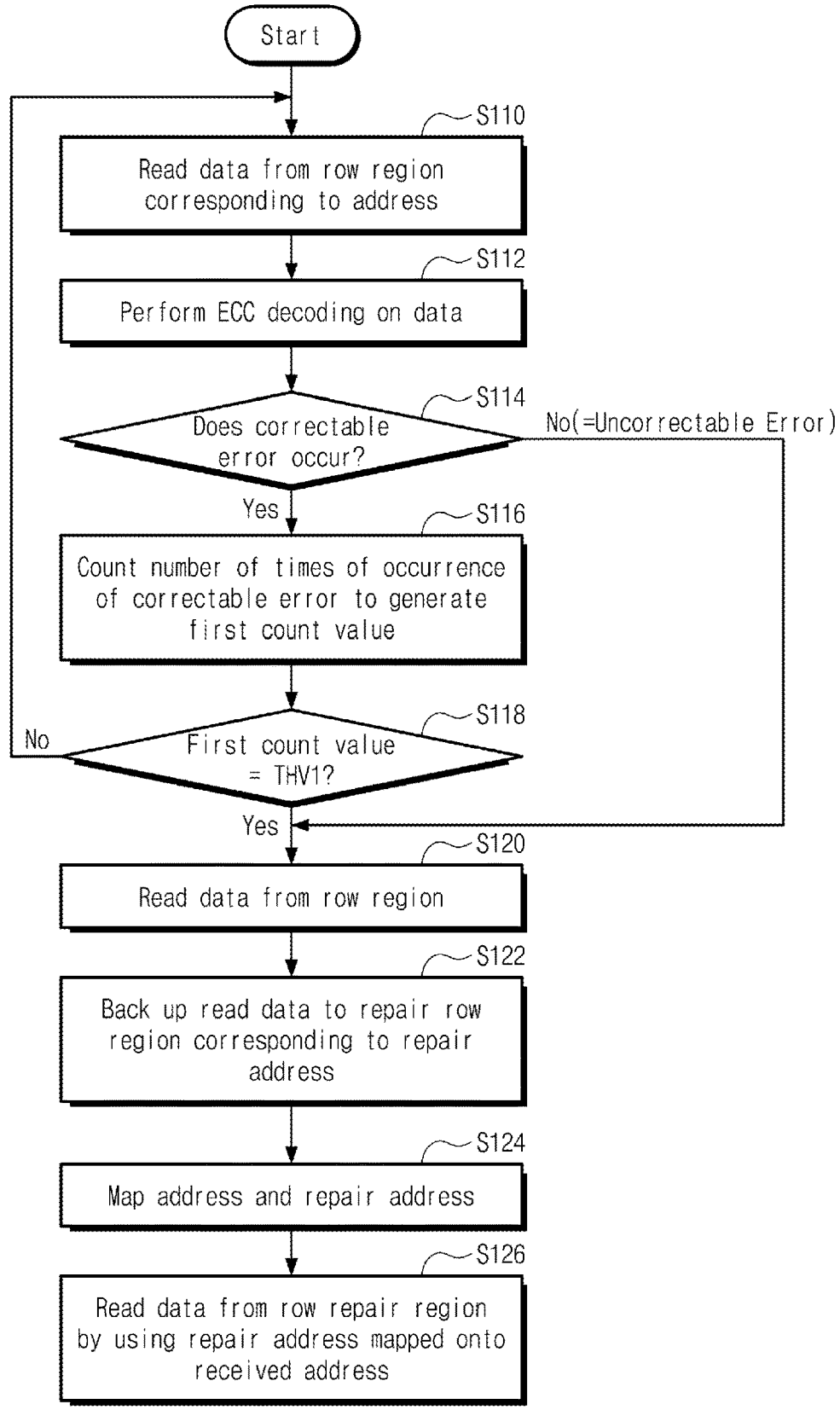
FIG. 8 is a flowchart for describing an example embodiment of an operation of a memory system illustrated in FIG. 1.
Figure 9:
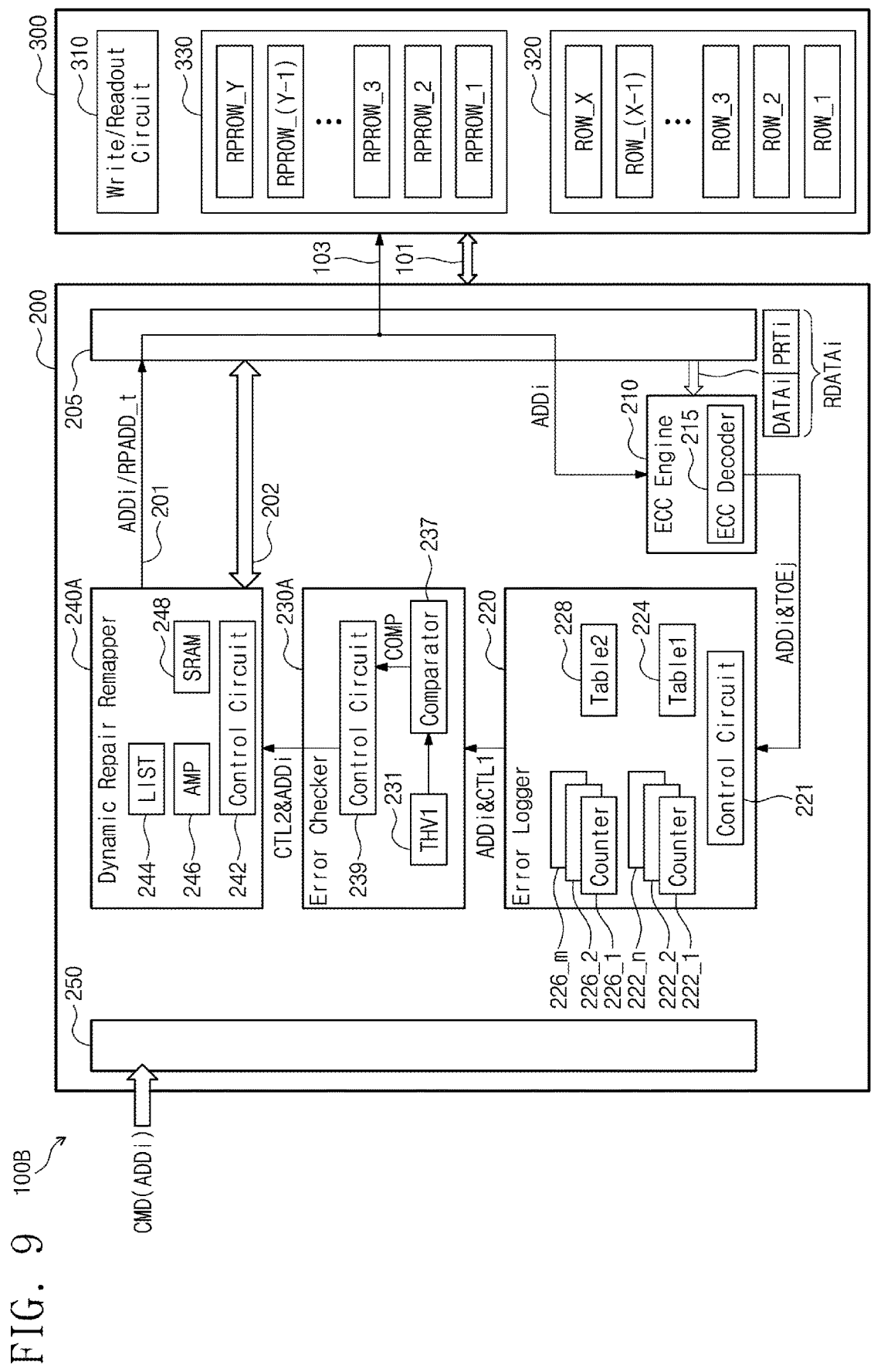
FIG. 9 is a block diagram of a memory system configured to perform, or capable of performing an operation that corresponds to the flowchart illustrated in FIG. 8.

FIG. 8 is a flowchart for describing an example embodiment of an operation of a memory system illustrated in FIG. 1, and FIG. 9 is a block diagram of a memory system configured to perform, or capable of performing, an operation corresponding to the flowchart illustrated in FIG. 8.

Referring to FIGS. 8 and 9, an error checker 230A of a memory system 100B may include the first memory 231 that stores the first threshold value THV1, the comparator 237, and the control circuit 239. The dynamic repair remapper 240A of FIG. 9 may include the control circuit 242, the first memory device 244, and the second memory device 246. According to some embodiments, the dynamic repair remapper 240A may further include the SRAM 248.

A method for repairing a faulty (or defective) row region dynamically during the runtime as soon as the uncorrectable error occurs is described with reference to FIGS. 2 to 6, 8, and 9.

Operation S110 to operation S114, operation S122, operation S124, and operation S126 illustrated in FIG. 8 are identical to operation S110 to operation S114, operation S122, operation S124, and operation S126 illustrated in FIG. 6, and thus, description thereof will be omitted here in favor of the discussion provided above to avoid redundancy.

Referring to FIG. 8, ECC decoding may be performed the second data RDATA2 read out from the second row region ROW_2 depending on the read command CMD including the second address ADD2 (operation S112 of FIG. 8); when an ECC decoding result indicates that the uncorrectable error is detected from the second data RDATA2 (No branch from operation S114 of FIG. 8), the ECC decoder 215 may transmit the second error type information TOE2 to the error logger 220 together with the second address ADD2.

The control circuit 221 of the error logger 220 may receive the second address ADD2 and the second error type information TOE2 and may transmit the second address ADD2 and the second error type information TOE2 to the control circuit 239 of the error checker 230A.

The control circuit 239 of the error checker 230A may receive the second address ADD2 and the second error type information TOE2, and based on the on the second error type information TOE2 may disable (or avoid using) the comparator 237 and instead generate (e.g., immediately generate) the second control signal CTL2 that directs the backup of the second data RDATA2, and may transmit the second address ADD2 and the second control signal CTL2 to the dynamic repair remapper 240A.

The control circuit 242 of the dynamic repair remapper 240A may receive the second address ADD2 (=UC_ADD_2) and the second control signal CTL2 that directs the backup of the second data RDATA2 and reads the second data RDATA2 from the second row region ROW_2 associated with the second address ADD2 in response to the second control signal CTL2 (operation S120 of FIG. 8).

FIG. 10 is a block diagram of a data processing system including a memory system illustrated in FIG. 1, 7, or 9.

Referring to FIG. 10, a data processing system 400 may include the memory system 100, 100A, or 100B (hereinafter collectively referred to as memory system "100") and the processor 410. According to embodiments, the data processing system 400 may further include at least one of a nonvolatile memory device 420, a display device 430, and a communication device 440.

The memory system 100 may store the mapping information AMP, which may be generated during runtime by the dynamic repair remapper 240 or 240A, in the nonvolatile memory device 420. The memory system 100 may store the mapping information AMP in real time, periodically, or randomly. Accordingly, even if the memory system 100 or the data processing system 400 is powered off, the mapping information AMP may be retained in the nonvolatile memory device 420.

When the memory system 100 or the data processing system 400 is powered on, the memory system 100 or the data processing system 400 may read the mapping information AMP from the nonvolatile memory device 420 and may store the read mapping information AMP in the second memory device 246 by using the dynamic repair remapper 240 or 240A, and thus, the control circuit 242 may access a repair row region by using the mapping information AMP, that is, by using a repair address mapped onto an address.

In some embodiments, the memory controller 200 may generate the mapping information AMP by mapping an address of a row region and a repair row address of a repair row region and may transmit the mapping information AMP to the nonvolatile memory device 420 before the memory controller 200 is powered off; after the memory controller 200 is again powered on, the memory controller 200 may read the mapping information AMP stored in the nonvolatile memory device 420, may receive a read command including the address, and may read the data backed up to the repair row region by using the repair address, based on the read command and the mapping information AMP.

The nonvolatile memory device 420 may be a solid state drive (SSD), but the present disclosure is not limited thereto.

As non-limiting examples, the data processing system 400 may be a personal computer (PC), a data storage device for server, an in-vehicle infotainment (IVI) system, or a mobile device. The mobile device may be a smartphone, a laptop computer, or a mobile Internet device (MID).

The devices 100, 410, 420, 430, and/or 440 may exchange data with each other through a bus 401.

The processor 410 may transmit the read command CMD including the address ADDi to the memory controller 200 of the memory system 100 and may receive data DATAi transmitted from the memory controller 200.

The processor 410 may transmit the write command CMD including the address ADDi and data to the memory controller 200 of the memory system 100, and the memory device 300 may write the data in at least one row region associated with the address ADDi from among the row regions ROW_1 to ROW_X under control of the memory controller 200.

The processor 410 may write data output from the memory system 100 or data output from the communication device 440 in the nonvolatile memory device 420 or may display the data through the display device 430.

The communication device 440 may be a wired or wireless communication device configured to connect, or capable of connecting, to a network, such as an Internet network (e.g., the Internet), a Wi-Fi network, or a mobile communication network.

Methods described herein and devices, such as devices 200 or 400, that perform or are configured to perform the methods, may provide a way to back up data stored in a faulty (or defective) row region to a repair row region during runtime and to map an address of the faulty (or defective) row region onto a repair address of the repair row region, instead of avoiding the faulty (or defective) row region by blocking the access of a system (e.g., a memory controller or a processor) to the faulty (or defective) row region during runtime. Accordingly, even though the faulty (or defective) row region exists, the system may be able to perform the read operation on the memory device.

Methods provided herein and the devices performing the methods may be used for the RAS (Reliability, Availability and Serviceability) that is dynamically applicable during runtime. RAS may be a computer hardware engineering term indicating to remove hardware failures for the purpose of ensuring the maximum system uptime.

Some methods according to example embodiments of the present disclosure and system configured to perform or capable of performing one or more of the methods herein may repair faulty memory cells detected during runtime with repair memory cells dynamically and in real time.

Accordingly, it may be possible to prevent the memory device itself from being determined as a faulty memory device. It also may be possible to increase the lifetime of the memory device.

While the present disclosure has been described with reference to some examples of embodiments thereof, it will be apparent to those of ordinary skill in the art that various changes and modifications may be made thereto without departing from the scope of the present disclosure as set forth in the following claims.

What is claimed is:

1. A method of operation of a memory controller which controls an operation of a memory device that includes a memory region and a repair memory region, the memory controller comprising a first error counter and a second error counter, the method comprising:
receiving an address associated with the memory region that is included in a first read command and data read out from the memory region associated with the address;
decoding the data using an error correction code and detecting an error included in the data;
generating error type information indicating a type of the error included in the data;
updating, based on the error type information, a count value of one of the first error counter and the second error counter associated with the address, the count value indicating a number of times that the type of error indicated by the error type information has occurred for the address;
comparing the count value with a threshold value, wherein the threshold value is one of a first threshold value and a second threshold value smaller than the first threshold value, wherein the first threshold value is associated with the first error counter, and wherein the second threshold value is associated with the second error counter; and
when the count value is equal to the threshold value, backing up the data that is stored in the memory region associated with the address to the repair memory region.

2. The method of claim 1, further comprising:
mapping the address associated with the memory region and a repair address associated with the repair memory region;
receiving a second read command including the address associated with the memory region; and
responsive to the second read command, reading the data backed up to the repair memory region by using the repair address.

3. The method of claim 1, wherein the data stored in the memory region are backed up during runtime,
wherein the method further comprises:
mapping the address associated with the memory region and a repair address associated with the repair memory region, resulting in mapping information;
prior to a powering off of the memory controller, transmitting the mapping information to an external nonvolatile memory device such that the mapping information is stored in the external nonvolatile memory device; and
subsequent to a powering on of the memory controller, reading the mapping information from the external nonvolatile memory device;
receiving a second read command including the address associated with the memory region; and
responsive to the second read command, reading the data backed up to the repair memory region by using the repair address.

4. The method of claim 1, wherein the updating of the count value includes:
when the error type information indicates that the error is a correctable error, using the first error counter allocated to the address, the first error counter from a first group of error counters; and
when the error type information indicates that the error is an uncorrectable error, using the second error counter allocated to the address, the second error counter from a second group of error counters differing from the first group.

5. The method of claim 4, wherein the memory device is a dynamic random access memory (DRAM),
wherein the comparing includes:
when the error type information indicates that the error is the correctable error, comparing the count value and the first threshold value; and
when the error type information indicates that the error is the uncorrectable error, comparing the count value and the second threshold value, and
wherein the backing up the data includes:
when the count value is equal to the first threshold value or when the count value is equal to the second threshold value, backing up the data stored in the memory region to the repair memory region.

6. A memory controller configured to control an operation of a memory device that includes a memory region and a repair memory region, the memory controller comprising:
an error correction code decoder configured to receive an address associated with the memory region that is included in a first read command and data read out from the memory region associated with the address, the error correction code decoder further configured to generate, responsive to performing error correction code decoding on the data, error type information indicating a type of an error included in the data, and to output the address and the error type information;
an error logger comprising a first error counter and a second error counter, the error logger configured to receive the address and the error type information from the error correction code decoder, to select one of the first error counter and the second error counter based on the error type information, to update a count value of the selected one of the first error counter and the second error counter that indicates a number of times the type of error indicated by the error type information has occurred for the address, and to output the address and the count value from the selected one of the first error counter and the second error counter; and
an error checker configured to receive the address, the error type information, and the count value from the error logger, to compare the count value with one of a first threshold value and a second threshold value based on the selected one of the first error counter and the second error counter, and to output the address and a control signal when the count value is equal to the one of the first threshold value and the second threshold value.

7. The memory controller of claim 6, further comprising:
a dynamic repair remapper configured to receive the control signal and in response thereto back up the data stored in the memory region associated with the address to the repair memory region.

8. The memory controller of claim 7, wherein the dynamic repair remapper is configured to:
map the address associated with the memory region and a repair address associated with the repair memory region; and
transmit, in response to a second read command that includes the address associated with the memory region, the repair address to the memory device such that the memory device transmits the data backed up to the repair memory region to the memory controller.

9. The memory controller of claim 7, wherein the error logger includes a first group of error counters and a second group of error counters, and wherein the error logger is configured to:
when the error type information indicates that the error is a correctable error, use the first error counter of the first group of error counters to the address; and
when the error type information indicates that the error is an uncorrectable error, use the second error counter of the second group of error counters to the address.

10. The memory controller of claim 9, wherein the error checker is configured to:
compare the first threshold value and the count value when the error type information indicates that the error is the correctable error;
output the address and the control signal when the count value is equal to the first threshold value;
compare the second threshold value and the count value when the error type information indicates that the error is the uncorrectable error; and
output the address and the control signal when the count value is equal to the second threshold value.

11. The memory controller of claim 9, wherein the error checker includes:
a first memory device configured to store the first threshold value and the second threshold value;
a select circuit connected with the first memory device, and configured to output the first threshold value or the second threshold value based on a selection signal;
a comparator configured to compare an output value of the select circuit and the count value and to output a comparison signal; and
a control circuit, wherein the control circuit is configured to:
when the error type information indicates that the error is the correctable error, generate the selection signal to direct output of the first threshold value;
when the error type information indicates that the error is the uncorrectable error, generate the selection signal to direct output of the second threshold value; and
transmit the address and the control signal to the dynamic repair remapper in response to the comparison signal generated when the output value of the select circuit is equal to the count value.

12. The memory controller of claim 7, wherein the dynamic repair remapper includes a first memory device configured to store repair addresses and a second memory device configured to store an address-repair address mapping table, and wherein the dynamic repair remapper is configured to:
read the data stored in the memory region associated with the address in response to the control signal;
select a first repair address of the repair addresses;
back up the data to the repair memory region associated with the first repair address; and
map the address and the first repair address as mapping information in the address-repair mapping table.

13. A memory system comprising:
a memory device including a memory region and a repair memory region; and
a memory controller configured to control an operation of the memory device,
wherein the memory controller includes:
an error correction code decoder configured to receive an address associated with the memory region that is included in a first read command and data read out from the memory region associated with the address, the error correction code decoder further configured to generate, responsive to performing error correction code decoding on the data, error type information indicating a type of an error included in the data, and to output the address and the error type information;
an error logger comprising a first error counter and a second error counter, the error logger configured to receive the address and the error type information from the error correction code decoder, to select one of the first error counter and the second error counter based on the error type information, to update a count value of the selected one of the first error counter and the second error counter that indicates a number of times the type of error indicated by the error type information has occurred for the address, and to output the address and the count value from the selected one of the first error counter and the second error counter; and
an error checker configured to receive the address, the error type information, and the count value from the error logger, to compare the count value with one of a first threshold value and a second threshold value based on the selected one of the first error counter and the second error counter, and to output the address and a control signal when the count value is equal to the one of the first threshold value and the second threshold value.

14. The memory system of claim 13, wherein the memory controller further includes:
a dynamic repair remapper configured to receive the control signal and in response thereto back up the data stored in the memory region associated with the address to the repair memory region.

15. The memory system of claim 14, wherein the dynamic repair remapper is configured to:
map the address associated with the memory region and a repair address associated with the repair memory region, resulting in mapping information; and
transmit, in response to a second read command that includes the address associated with the memory region, the repair address to the memory device such that the memory device transmits the data backed up to the repair memory region to the memory controller.

16. The memory system of claim 15, wherein the dynamic repair remapper is configured to:
back up the data to the repair memory region during a runtime of the memory controller; and
transmit the mapping information to an external nonvolatile memory device such that the mapping information is stored in the external nonvolatile memory device.

17. The memory system of claim 14, wherein the error logger includes a first group of error counters and a second group of error counters, and wherein the error logger is configured to:
when the error type information indicates that the error is a correctable error, use the first error counter of the first group of error counters; and when the error type information indicates that the error is an uncorrectable error, use the second error counter of the second group of error counters.

18. The memory system of claim 17, wherein the error checker includes:
a first memory device configured to store the first threshold value and the second threshold value;
a select circuit connected with the first memory device, and configured to output the first threshold value or the second threshold value based on a selection signal;
a comparator configured to compare an output value of the select circuit and the count value and to output a comparison signal; and
a control circuit, wherein the control circuit is configured to:
when the error type information indicates that the error is the correctable error, generate the selection signal to direct output of the first threshold value;
when the error type information indicates that the error is the uncorrectable error, generate the selection signal to direct output of the second threshold value; and
transmit the address and the control signal to the dynamic repair remapper in response to the comparison signal generated when the output value of the select circuit is equal to the count value.

19. The memory system of claim 14, wherein the dynamic repair remapper includes:
a first memory device configured to store repair addresses; and
a second memory device configured to store an address-repair address mapping table, and
wherein the dynamic repair remapper is configured to:
read the data stored in the memory region associated with the address in response to the control signal;
select a first repair address of the repair addresses;
back up the data to the repair memory region associated with the first repair address; and
map the address and the first repair address as mapping information in the address-repair mapping table.

20. A data processing system comprising:
the memory system of claim 13; and
a processor configured to transmit the first read command to the memory controller of the memory system.

* * * * *